United States Patent [19]
Bruyère

[11] 3,956,707
[45] May 11, 1976

[54] FLOATING MEASUREMENT AMPLIFIER

[76] Inventor: Jean-Marie Bruyère, 22, rue Louis Blanc, Paris, France, 75010

[22] Filed: Jan. 16, 1975

[21] Appl. No.: 541,594

[30] Foreign Application Priority Data
Feb. 4, 1974  France .............................. 74.03586

[52] U.S. Cl. ................................. 330/10; 307/261; 324/118
[51] Int. Cl.² ........................................... H03F 3/38
[58] Field of Search ...................... 330/10; 324/118; 307/261

[56] References Cited
UNITED STATES PATENTS
3,887,877   6/1975   Vosteen .............................. 330/10

*Primary Examiner*—Siegfried H. Grimm
*Attorney, Agent, or Firm*—Laurence, Stokes & Neilan

[57] ABSTRACT

A floating measurement amplifier comprising an emitter and a receiver ferromagnetically coupled but totally separated from each other galvanically, the emitter comprising a modulator feeding the primary winding of a signal transformer and a feed device feeding the primary winding of a feed transformer, and the receiver comprising a demodulator, identical to the modulator controlling the feed of the secondary winding of the signal transformer and an oscillator connected to the secondary winding of the feed transformer, said modulator and demodulator being formed of transistors controlled by their bases, the modulator being connected to the primary winding of the signal transformer and, through a capacitor, to the primary winding of the feed transformer, and the demodulator being connected to the secondary winding of the signal transformer and, through a capacitor, to the secondary winding of said feed transformer.

2 Claims, 4 Drawing Figures

FLOATING MEASUREMENT AMPLIFIER

The present invention relates to a so-called "floating" measurement amplifier, i.e. functioning normally without earth reference. The input potential of such a potentiometer may float, with respect to the output earth, by several thousands of volts in the positive direction or in the negative direction. Such an amplifier is used in particular for measuring voltages between an electric network and earth, in medical applications, etc..

Known amplifiers of this type comprise an emitter and receiver which are totally separated galvanically from each other by a suitable shield, but coupled ferromagnetically. To this end, the emitter comprises on the one hand an amplifier whose inputs constitute the inputs of the floating amplifier and whose output is connected to a modulator feeding the primary winding of a signal transformer and on the other hand a feed device feeding the primary winding of a feed transformer. The receiver comprises, for its part, an amplifier whose output constitutes the output of the floating amplifier and whose input is connected to a demodulator controlling the feed of the secondary winding of the signal transformer and an oscillator connected to the secondary winding of the feed transformer. Furthermore, the feed transformer comprises windings controlled by the oscillator and intended to control the modulator and demodulator. Of course, the shield galvanically separates the primary and secondary windings of the signal transformer, the primary and secondary of the feed transformer, the control windings of the modulator and those of the demodulator.

In the known amplifiers, the modulator and demodulator are formed by switch transistors respectively controlling the passage of the measuring signal in the primary and secondary windings of the signal transformer, these transistors themselves being controlled by their bases by said control windings.

Consequently, in these known floating amplifiers, the feed transformer is complicated and expensive, since it must comprise numerous control windings. Its balancing is therefore also difficult. Moreover, it is often necessary to provide transistors supporting very high emitter-base voltages.

The present invention remedies these drawbacks. According to the invention, the floating measurement amplifier comprising an emitter and a receiver ferromagnetically coupled but totally separated from each other galvanically, the emitter comprises a modulator feeding the primary winding of a signal transformer and a feed device feeding the primary winding of a feed transformer and in which the receiver comprises a demodulator identical to the modulator controlling the feed of the secondary winding of the signal transformer and an oscillator connected to the secondary winding of the feed transformer, said modulator and demodulator being formed of transistors controlled by their bases, the modulator being connected on the one hand to the primary winding of the signal transformer and, on the other hand, through a capacitor, to the primary winding of the feed transformer and the demodulator is connected on the one hand to the secondary winding of the signal transformer and on the other hand, through a capacitor, to the secondary winding of said feed transformer.

The modulator and demodulator are each preferably formed by a couple of transistors of the sames types with connected emitters, the bases of these transistors being earthed possibly by resistors, on the one hand to the emitter or to the receiver and on the other hand to said capacitor, whilst one of the collectors of the transistors is connected to said primary winding or to the secondary winding of the signal transformer, the other collector being earthed to the emitter or of the receiver.

Thus, the measurement signal to be transmitted from the emitter to the receiver is cut out at the recurrence frequency of the oscillator, no control winding being provided.

The invention will be more readily understood on reading the following description with reference to the accompanying drawings, in which.

In these Figures identical references correspond to identical elements.

Figure 1:
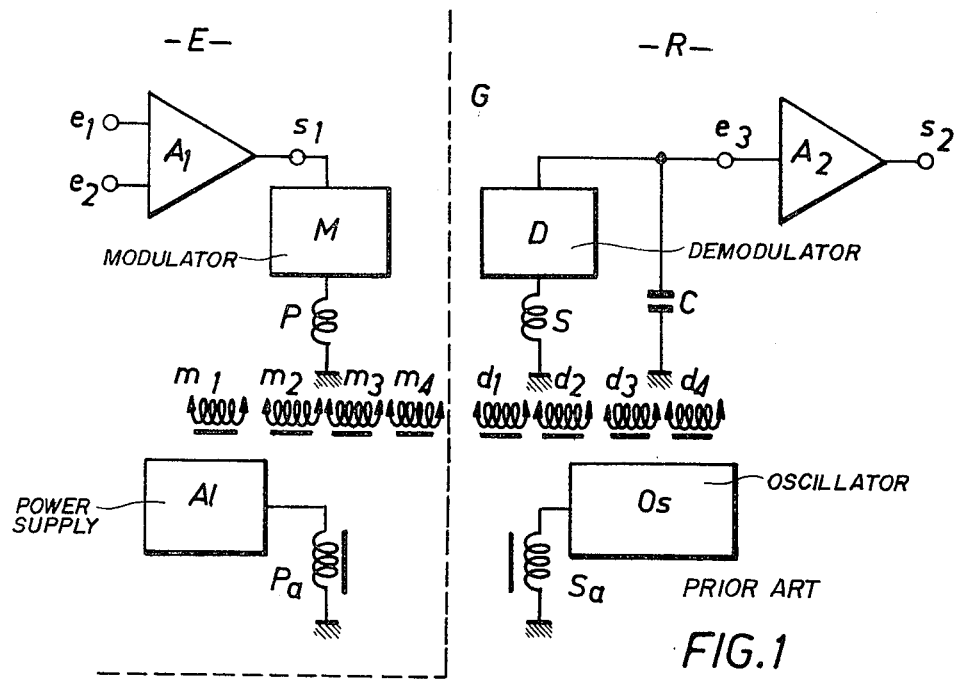
FIG. 1 is a synoptic diagram of a floating amplifier of known type.

Referring now to the drawings, the floating amplifier of known type, shown in FIG. 1, comprises an emitter E and a receiver R separated galvanically from each other by a shield G. The emitter E comprises an amplifier A1 whose inputs e1 and e2 constitute the inputs of said floating amplifier and whose output S1 is connected to a modulator M, controlling the feed of the primary winding P of a signal transformer P,S. Furthermore, the emitter E comprise a feed device or power supply A1, feeding the primary winding Pa of a feed transformer Pa, Sa.

The receiver R comprises an amplifier A2 whose output S2 constitutes the output of the floating amplifier and whose input e3 is connected to a demodulator D, controlling the supply of the secondary winding S of the signal transformer P,S. An integration capacitor C may be mounted between the input e3 and earth.

Moreover, the receiver R comprises an oscillator OS to the secondary winding Sa of the feed transformer Pa, Sa.

This feed transformer Pa, Sa comprises in addition a plurality of control windings of which certain ($m1, m2, m3, m4$) are intended for controlling the modulator M and others ($d1, d2, d3, d4$) for controlling the demodulator D.

The shield G separates galvanically, but not ferromagnetically, the primary winding P from the secondary winding S, the primary winding Pa from the secondary winding Sa and the control windings $m1, m2, m3, m4$ from control windings $d1, d2, d3, d4$. Thus, the measurement signal may be transferred from the emitter E to the receiver R, by means of the transformer P,S, depending on the modulator M and the demodulator D.

Figure 2:
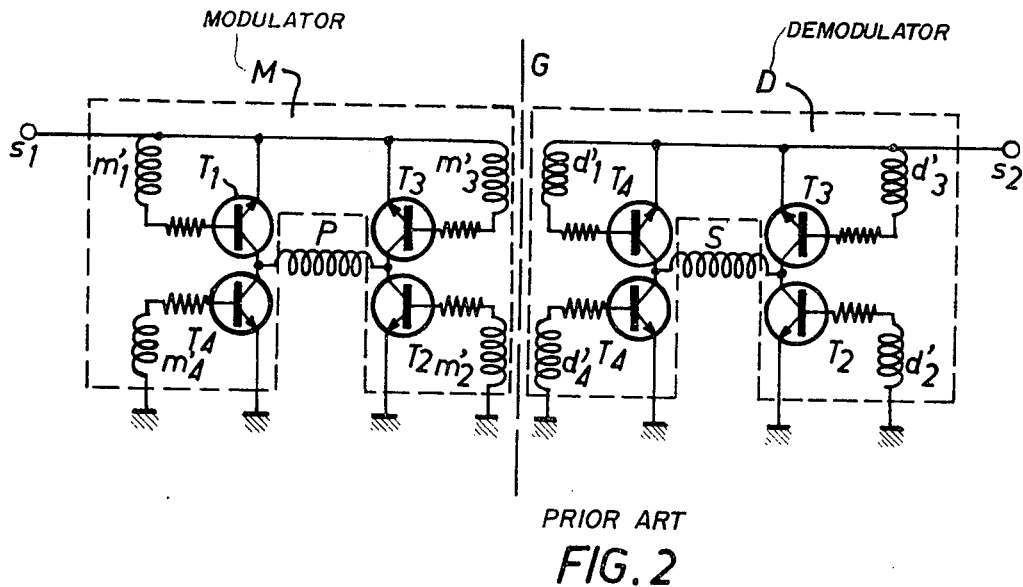
FIGS. 2 and 3 show examples of known modulators and demodulators for the floating amplifier of FIG. 1.

FIG. 2 illustrates a known type of modulator M and demodulator D with double half-wave. These latter are identical and are each formed by a transistor bridge T1 to T4 in one diagonal of which is mounted either the primary winding P or the secondary winding S. The simultaneous conduction of the transistors T1, T2, T3, T4 is controlled by means of windings $m'1, m'2, m'3, m'4$, or $d'1, d'2, d'3, d'4$ respectively coupled to windings $m1, m2, m3, m4$ or $d1, d2, d3, d4$. The embodiment of FIG. 2 therefore necessitates eight windings ($m''1$ to $m''4$ and $d''1$ to $d''4$) for controlling the modulator M and the demodulator D.

The transformer P, S is therefore complicated and expensive. Moreover, special transistors are necessary which support emitter-base voltages which are double the value of the measurement signal to be transmitted. It is therefore impossible to transmit signals of high frequency. The frequency of 10 KHz is an upper limit.

Figure 3:
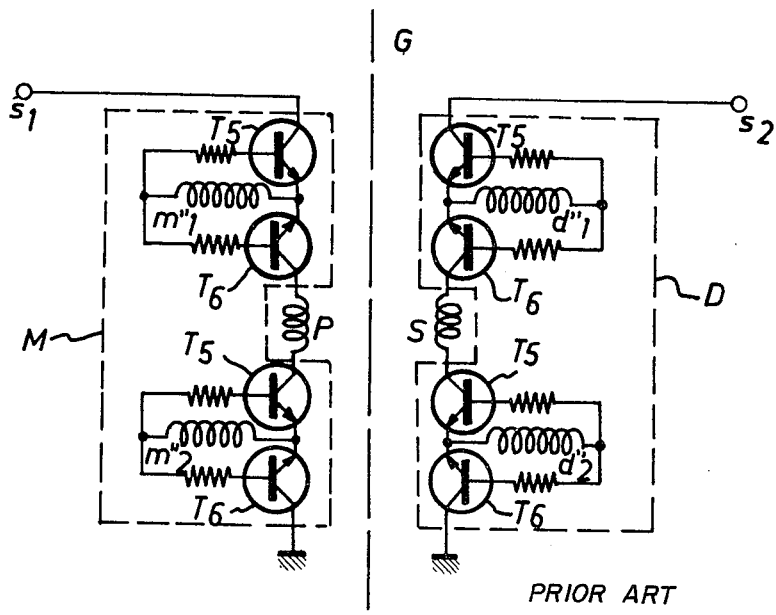

FIG. 3 illustrates another known type of modulator M and demodulator D with single half-wave. These latter are also identical and are each formed by two switches placed upstream and downstream respectively of the winding P or winding S. Each switch is formed by two transistors T5 and T6 opposite types, with common emitter, controlled between base and emitter by a control winding $m''1, m''2$ or $d''1, d''2$, respectively coupled to a winding $m1$ to $m4$ and $d1$ to $d4$. This type of modulator and demodulator neccessitates a further four control windings. The transformer P, S therefore remains complicated and expensive. Moreover this type necessitates a large number of elements.

Figure 4:
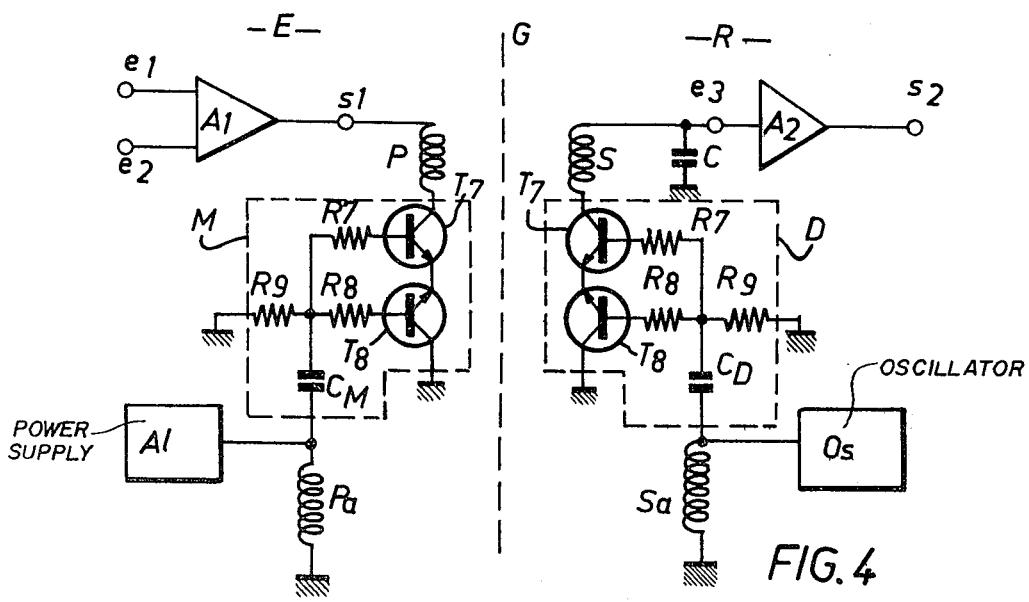
FIG. 4 illustrates the invention.

FIG. 4 illustrates the type of modulator and demodulator according to the invention. The modulator M and demodulator D according to the invention comprise two transistors T7 and T8 of the same types whose emitters are connected and whose bases are connected by means of resistors R7 and R8. The point common to the resistors R7 and R8 is earthed on the one hand to the emitter E or to the receiver R, by a resistor R9, on the other hand, by means of a capacitor CM or CD either to the primary winding Pa or to the secondary winding Sa. The collector of the transistor T8 is earthed either to the emitter E or receiver R, whilst the collector of the transistor T7 is connected either to the primary winding P or the seconary winding S.

In this way, the modulator M and demodulator D are controlled directly by the oscillator OS and the measurement signal to be transmitted is cut out at the recurrence frequency of this oscillator.

By effect of detection on the bases, the control signal is restored with respect to earth according to the polarity of the transistors used. Each couple of transistors acts almost perfectly as switch. The modulation is of the simple half-wave type.

The integration capacitor C restores the half-wave signal with respect to the earth of the receiver, with a linearity which may be of 0.01% of the end of the scale. The dynamics of the modulator according to the invention in peak to peak values are substantially equal to the peak to peak value of the cut-out signal. The modulator according to the invention therefore makes it possible to transmit signals from the continuous to several hundreds of KHz.

What is claimed is:

1. A floating measuring amplifier comprising:
   an emitter comprising:
   a primary winding of a signal transformer;
   a modulator adapted to feed said primary winding;
   a first capacitor having first and second terminals, said first terminal being connected to said modulator;
   a primary winding of a feed transformer having first and second terminals; said first terminal of said feed transformer being connected to the second terminal of said first capacitor and said second terminal of said primary winding of said feed transformer being grounded;
   a power source connected at the connection point of said first terminal of said primary winding of said feed transformer and said second terminal of said first capacitor;
   a reciever stage comprising:
   a secondary winding of said signal transformer;
   a demodulator adapted to control the feed to said signal transformer secondary winding;
   a second capacitor having first and second terminals, said first terminal being connected to said demodulator;
   a secondary winding of said feed transformer, said secondary winding of said feed transformer having first and second terminals, said first terminal of said secondary winding of said feed transformer being connected to said second terminal of said second capacitor; said second terminal of said secondary winding of said feed transformer being grounded;
   an oscillator connected to said first terminal of said secondary winding of said feed transformer; and
   a shield completely separating said receiver from said emitter and isolating said receiver from said emitter galvanically while permitting said receiver and emitter to be coupled ferromagnetically.

2. The floating measurement amplifier of claim 1, wherein said modulator comprises first and second transistors of the same type having their emitters connected; their bases connected to respective first terminals of respective first and second resistors, the second terminals of said respective resistors being connected together to the first terminal of said first capacitor and to a third resistor connected to the ground of said emitter; the collector of said first transistor being connected to said primary winding of said signal transformer; the collector of said second transistor being connected to the ground of said emitter; and wherein said demodulator comprises third and fourth transistors of the same type having their emitters connected, their bases connected to respective first terminals of respective fourth and fifth resistors, the second respective terminals of said fourth and fifth resistors being connected together to the first terminal of said capacitor and to a sixth resistor connected to the ground of said receiver; the collector of said third transistor being connected to the secondary winding of said signal transformer; the collector of said fourth transistor being connected to the ground of said receiver.

* * * * *